US005498904A

United States Patent [19]
Harata et al.

[11] Patent Number: 5,498,904
[45] Date of Patent: Mar. 12, 1996

[54] POLYCRYSTALLINE SEMICONDUCTIVE FILM, SEMICONDUCTOR DEVICE USING THE SAME AND METHOD OF MANUFACTURING THE SAME

[75] Inventors: Yasuki Harata; Masaaki Kameda; Keiichi Sano; Yoichiro Aya, all of Osaka, Japan

[73] Assignee: Sanyo Electric Co., Ltd., Moriguchi, Japan

[21] Appl. No.: 312,610

[22] Filed: Sep. 27, 1994

[30] Foreign Application Priority Data

Feb. 22, 1994 [JP] Japan ..................................... 6-024329

[51] Int. Cl.⁶ ........................... H01L 29/06; H01L 21/469
[52] U.S. Cl. ........................... 257/62.3; 257/466; 257/75; 257/64; 136/258; 437/173; 437/233; 437/4
[58] Field of Search ................................. 257/49, 64, 72, 257/74, 75, 466, 623, 627; 136/258 PL; 437/4, 173, 174, 233

[56] References Cited

U.S. PATENT DOCUMENTS

| | | | |
|---|---|---|---|
| 4,781,766 | 11/1988 | Barnett et al. | 136/258 |
| 5,155,051 | 10/1992 | Noguchi et al. | 136/258 |
| 5,264,070 | 11/1993 | Urquhart et al. | 156/603 |

FOREIGN PATENT DOCUMENTS 9006591  6/1990  WIPO ........................... H01L 21/20

Primary Examiner—Jerome Jackson, Jr.
Assistant Examiner—Nathan K. Kelley
Attorney, Agent, or Firm—Darby & Darby

[57] ABSTRACT

A semiconductive film is formed on a substrate having a surface with indentations defining a plurality of plane regions and elevated step difference portions between adjacent plane regions. The semiconductive film is irradiated with energy beams to be polycrystallized, whereby the positions of the crystal grain boundaries in the polycrystalline semiconductive film are controlled.

19 Claims, 9 Drawing Sheets

POLYCRYSTALLINE SEMICONDUCTIVE FILM, SEMICONDUCTOR DEVICE USING THE SAME AND METHOD OF MANUFACTURING THE SAME

BACKGROUND OF THE INVENTION

1. Field of the Invention

This invention relates to a thin film transistor and a photovoltaic cell using polycrystalline semiconductive films as a channel layer and a photo-activation layer, respectively, and a method of manufacturing the polycrystalline semiconductor film used for them.

2. Description of the Prior Art

Recently, a thin film transistor has been widely used as a driving element such as a liquid crystal display or a contact type image sensor. In this thin film transistor, a thin film semiconductor serves as an activation layer in which carriers move.

Since the thin film semiconductor can be formed on an insulating substrate of glass, quartz or the like and also can be formed on a relatively large substrate, unlike a conventional semiconductor formed of a single crystal, it can be applied to a device, which is rather difficult for the conventional single crystal semiconductor.

Although an amorphous semiconductor represented by an amorphous silicon film has been conventionally used as the thin film semiconductor, since carrier mobility in such amorphous semiconductive film is low because of its physical properties, its applicable field is limited.

When the thin film transistor formed of the amorphous semiconductive film can not cover the problem of the carrier mobility in the conventional case for example, it becomes necessary to add elements such that an integrated circuit (IC) is formed on the substrate as a driving element and the IC and elements formed on the substrate are connected by wire-bonding.

A polycrystalline semiconductive film has been studied for use in the place of the amorphous semiconductor. Although there are various methods of manufacturing the polycrystalline semiconductive film, a method for forming the polycrystalline semiconductive film capable of being formed over a large area at low temperature has been especially considered.

In the polycrystalline semiconductive film the carrier mobility is more than 1000 times as high as that in the amorphous semiconductive film. Thus, the aforementioned additional elements are not necessary and any element can be formed on the substrate, which reduces manufacturing costs, for example.

Meanwhile, a solar cell using the thin film polycrystalline semiconductor is highly desirable because photovoltaic conversion efficiency can be improved at low costs. According to the solar cell formed of the polycrystalline semiconductive film, it is an indispensable condition to increase a crystal grain size in the polycrystalline semiconductive film and to improve the carrier mobility in the film.

As specific methods of manufacturing the polycrystalline semiconductive film, there are proposed methods such as: chemical vapor deposition (CVD) in which the polycrystalline semiconductive film is directly formed; solid phase crystallization (SPC) in which the amorphous semiconductive film is used as an initial material and it is polycrystallized by heat treatment at approximately 600° C. for several tens of hours to form the polycrystalline semiconductive film; or laser recrystallization in which the amorphous semiconductive film which is the initial material is irradiated with energy beams such as lasers to be partly melted to form the polycrystalline semiconductive film.

Generally, the grain boundaries are thought to largely influence the electrical characteristic of the polycrystalline semiconductive film. The polycrystalline semiconductive film is normally formed of many crystal grains surrounded by the grain boundaries, and the grain boundaries prevent carriers from moving in the semiconductive film. Therefore, it is important to form the polycrystalline semiconductive film so as to control generation of the grain boundaries.

In this respect, among the above several manufacturing methods, the polycrystalline semiconductive film formed by the solid phase crystallization or the laser recrystallization has usually large crystal grains, which can be of several μm, so that the number of grain boundaries can be reduced in the film and preferable polycrystalline semiconductive film can be formed. For example, as disclosed in U.S. Pat. No. 5,221,365, there is proposed a method of forming a polycrystalline semiconductive film having large grains by performing heat treatment onto an amorphous semiconductive film formed on a substrate having a textured surface.

According to the above method of manufacturing the polycrystalline semiconductive film, although relatively large crystal grains can be obtained, positions of the grain boundaries can not be controlled in the polycrystalline semiconductive film. More specifically, the positions of the grain boundaries in the formed polycrystalline semiconductive film occur based on several factors, such as heat efficiency or heat conductivity in the polycrystalline film, and a surface condition or a nuclear generating position in the substrate or crystal growing speed. Therefore, the positions of the grain boundaries and the size of the crystal grain usually can not be controlled.

Consequently, if the grain boundaries exist in the polycrystalline semiconductive film serving as a channel region of the thin film transistor, the carriers are prevented from conductivity and the preferable switching characteristics are not obtained.

In addition, since the grain boundaries which do not contribute to power generation exist at random in a solar cell, power generation efficiency per unit area is lowered. Additionally, since light carriers recombine in the grain boundaries, an adverse influence is exerted upon the photovoltaic conversion characteristic.

SUMMARY OF THE INVENTION

The present invention was made to solve the above problems. That is, it is a first object of the present invention is to provide a polycrystalline semiconductive film in which positions of crystal grain boundaries are controlled, and a method of manufacturing the film.

It is a second object of the present invention to provide a thin film transistor having large grain size in which grain boundaries do not exist in the polycrystalline semiconductive film serving as a channel region and preferable switching characteristics are obtained.

It is a third object of the present invention to provide a solar cell using a polycrystalline semiconductive film having large grain size in which current collecting efficiency is improved by controlling the grain boundaries which do not contribute to generation of power.

A polycrystalline semiconductive film according to the present invention is formed on a substrate having a surface with indentations consisting of a number of small plane regions and step difference portions between adjacent regions. In addition, grain boundaries in the polycrystalline conductive film are provided above the step difference portions of the substrate with the height of the step difference portion ranging from 30 to 500 Å.

A method of manufacturing a polycrystalline semiconductive film according to the present invention includes the steps of forming a semiconductive film on a substrate having a surface with indentations formed of a number of small plane regions and step difference portions between adjacent plane regions, and polycrystallizing the semiconductive film by irradiation of energy beams. In addition to irradiation by energy beams, the semiconductive film receives heat treatment.

According to the manufacturing method of the polycrystalline semiconductor of the present invention, since the grain boundaries exist above the step difference portions between adjacent small plane regions, the grain size and the positions of the grain boundaries in the polycrystalline semiconductive film can be controlled by controlling a size of the plane region and position of the step difference portion.

Furthermore, according to the polycrystalline semiconductive film of the present invention, since crystal orientation in the crystal grains surrounded by the grain boundaries above the step difference portions can be aligned in a specific direction, the electrical characteristics in the semiconductive film can be uniform.

A solar cell of the present invention includes a substrate serving as a first electrode and having a surface with indentations having a number of small plane regions and step difference portions between the adjacent plane regions, which step difference portions control the positions of the grain boundaries, a polycrystalline semiconductive film of one conductivity type formed on the substrate, which includes the position-controlled grain boundaries according to the indented configuration of the substrate surface, a semiconductive layer of the other conductivity type formed on the polycrystalline semiconductive film, and a transparent electrode formed on the semiconductive layer. In addition, the grain boundaries in the polycrystalline semiconductive film are provided above the step difference portions of the substrate and collecting electrodes are provided on the transparent electrode positioned at the grain boundaries.

According to the solar cell of the present invention, collecting electrodes for collecting light carriers are provided on a surface of the polycrystalline semiconductive film having crystal grain boundaries whose positions are specified by the step difference portions on the substrate, which means that there are provided the collecting electrodes in the vicinity of the grain boundaries which generally recombines light carriers and exerts an adverse influence upon the photovoltaic conversion characteristics. Consequently, generation of such recombination can be prevented.

A thin film transistor according to the present invention comprises a substrate having a surface with indentations consisting of a number of small plane regions and step difference portions between adjacent regions, which portions control the positions of the grain boundaries, a polycrystalline semiconductive film formed on the substrate, which includes the position-controlled grain boundaries according to the indented configuration of the substrate surface, and source and drain regions formed so as to sandwich the channel region which is sandwiched by the grain boundaries.

When the polycrystalline semiconductive film of the present invention is used as the channel region of the thin film transistor, it is possible to form a state where the grain boundaries do not exist in the polycrystalline semiconductive film of the channel region. Thus, there can be provided a preferable element in which the grain boundaries do not prevent the carriers from moving and the switching characteristics are favorable, These and other objects and advantages of the present invention will be more fully apparent from the following detailed description,

BRIEF DESCRIPTION OF THE DRAWINGS

FIGS. 6A and 6B show a thin film transistor in which the polycrystalline semiconductive film of the present invention is used as a channel region, in which FIG. 6A is a sectional view and FIG. 6B is a plan view;

DESCRIPTION OF THE PREFFERRED EMBODIMENTS

FIGS. 1A to 1D are sectional views showing manufacturing process of a polycrystalline semiconductive film according to the present invention. According to a first step shown in FIG. 1A, a pattern of stripes of resist 2 is made by the well-known photolithography process on a surface of a substrate 1 of glass or quartz formed of SiNx or SiO$_2$ so as to form many small plane regions of certain configurations.

Figure 1A:
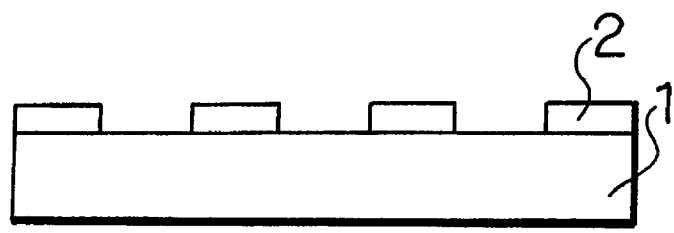
FIGS. 1A to 1D are sectional views showing manufacturing process of a polycrystalline semiconductive film of the present invention.
Figure 1B:
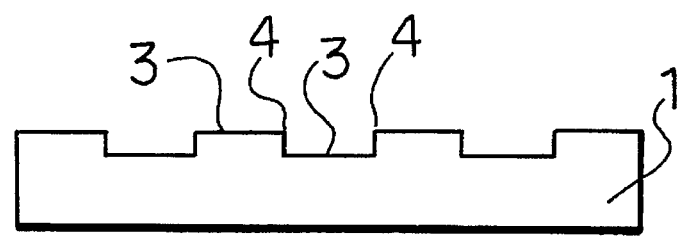

According to a second step shown in FIG. 1B, the substrate surface with the resist 2 formed thereon is etched away between the stripes of the resist 2 by reactive ion etching and then, the resist 2 is removed. Thus, many small plane regions 3 of certain configurations are formed and the substrate surface is indented.

Figure 2A:
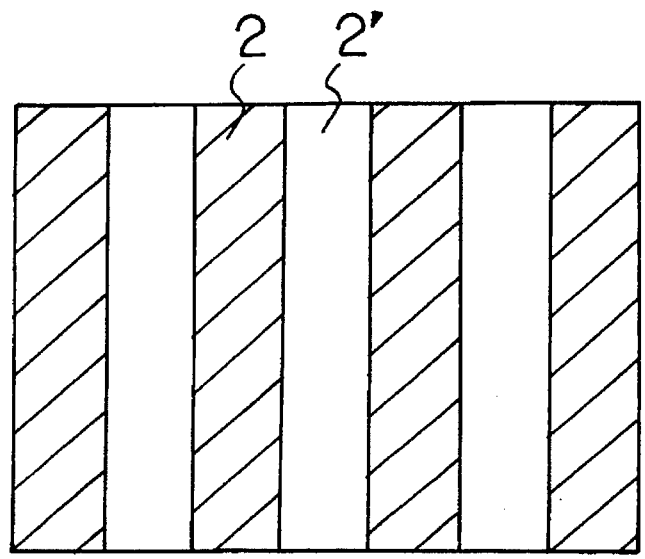
FIGS. 2A and 2B are plan view showing the polycrystalline semiconductive film of the present invention.

For example, a resist pattern shown in FIG. 2A formed by the patterning of the resist 2 is used to generate a step difference portion 4 between the regions 3 and 3 by the etching. FIG. 2A shows the surface of the substrate 1 which is viewed in the direction perpendicular to the plane of FIG. 1A. The resist 2 on the substrate 1 is lineally, patterned.

In this case, since a portion (corresponding to the region 2) which is not etched away because of protection of the resist and a portion 2' which is etched away are lineally formed, the step difference portion 4 is generated between the regions 3 and 3 (referring to FIG. 1B). The step difference is preferably well defined especially when polycrystallization is performed by energy beams. For example, an angle formed by the step difference 4 relative to the plane regions 3 is preferably close to 90 degrees.

According to the instant embodiment of the present invention, a distance between the lines is approximately 1 to 100 μm and the reactive gas used for the reactive ion etching may be $CHF_3$ gas or mixed gas of $CH_4$, $H_2$ and $N_2$ in a case where the substrate is quartz or glass formed of $SiO_2$.

According to the present invention, in addition to the above size, a depth of the step difference portion is also an important factor.

Although the depth of the step difference portion can be controlled by a degree (depth) of the reactive ion etching in the second step, the depth is preferably 30 to 500 Å, more preferably 50 to 300 Å, to be effective in the present invention. If the depth is 30 Å or less, a grain boundaries are not generated at the step difference portion. Meanwhile, if the depth is 500 Å or more, since crystal grains at a small region are largely separated at the step difference portion, the polycrystalline semiconductor film can not be continuously formed. The above facts are found through observation by an electron microscope.

Although the small region is in the form of a line or stripe as shown in FIG. 2A in this embodiment of the present invention, it is not limited to this, but the configuration may be set according to usage of the polycrystalline semiconductive film. More specifically, it may be in the form of a rectangle, lattice, rhomb, or circle.

In addition, a depth of the step difference portion formed by adjacent small regions is not necessarily uniform as in this embodiment of the present invention if it is within the above range.

Figure 1C:
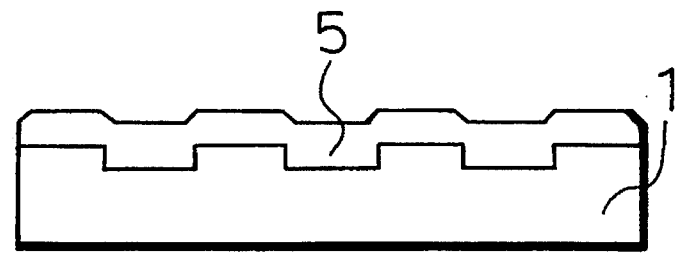

Then, according to a third step shown in FIG. 1C, an amorphous semiconductive film 5 formed of amorphous silicon is formed on the surface of the substrate with the small regions formed thereon. A film thickness thereof is 300 to 1200 Å, and the film is formed so as to cover the step difference portion 4. The amorphous semiconductive film 5 is formed by, for example plasma CVD. The condition of the plasma CVD are such that a silane ($SiH_4$) gas flow is 30 to 80 sccm (Standard Cubic Centimeters per Minute), a substrate temperature is at 100° to 600° C., pressure is 13.3 to 266 Pa, and the power is 13.56 MHz and 3 to 100 W.

Figure 1D:
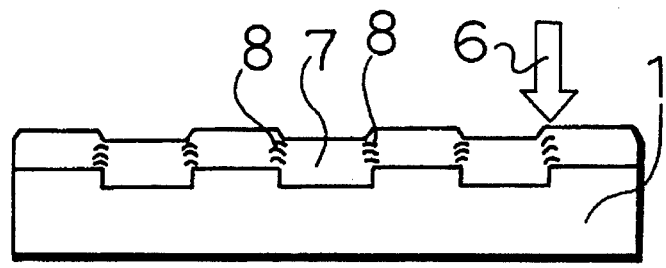

Then, according to a fourth step shown in FIG. 1D, energy beams 6 are applied to the amorphous semiconductive film 5 and the irradiated region is polycrystallized. Thus, a polycrystalline semiconductive film 7 formed of polycrystalline silicon is obtained.

Figure 2B:
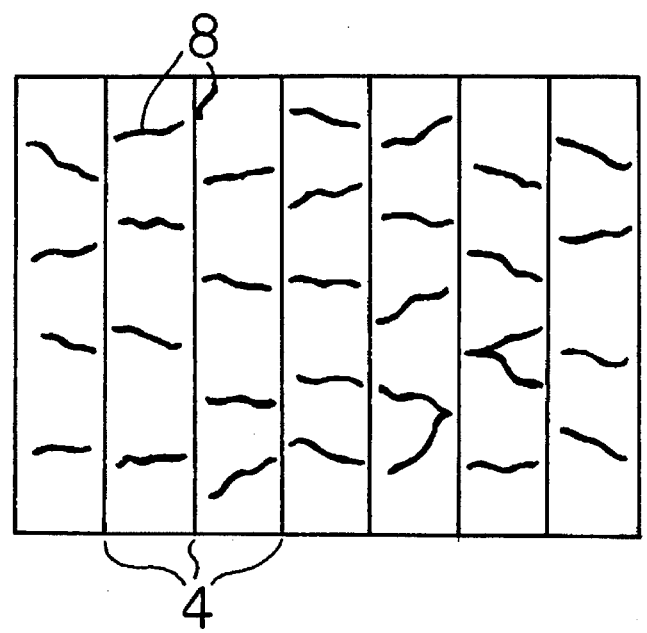

FIG. 2B shows a schematic view of the thus obtained polycrystalline semiconductive film viewed in the direction perpendicular to the surface thereof like FIG. 2A. As can be seen from FIG. 2B, the grain boundaries 8 are aligned with the line-formed step difference portion 4 and it can be confirmed that a crystal growth in the lateral direction is stopped by the step difference portion.

Additionally, as is clear from FIG. 2B, since the step difference portions are not provided in the line in the longitudinal direction, the crystal growth is stopped by the conventional various factors. Therefore, the configuration and the position of the crystal grain boundaries are at random.

Although the amorphous semiconductive film irradiated with the energy beams is formed by the CVD method in the instant embodiment, the manufacturing method is not limited to this, but other methods such as vapor deposition or sputtering may be employed. In addition, the semiconductive film to be irradiated with the energy beams may have been already polycrystallized. In this case, the initial inferior polycrystalline semiconductor can become a polycrystalline semiconductive film of good quality by irradiation of energy beams in which the positions of the grain boundaries are controlled according to the present invention.

As a specific example of an inferior polycrystalline semiconductive film, there is a polycrystalline silicon film or the like formed at a low temperature such as a normal temperature. According to the inferior polycrystalline semiconductive film, there are very many grain boundaries in the film and carrier mobility is very low.

However, regarding either the amorphous semiconductive film or the polycrystalline semiconductive film to be irradiated with the energy beams, in order to improve polycrystallization generated by the irradiation, a concentration of impurities such as oxygen, hydrogen, nitrogen or carbon in the semiconductive film is preferably as low as possible, for the reason that the above impurities prevent crystal growth during the polycrystallization. Therefore, in order to remove the impurities, for example, an ultimate degree of vacuum in an apparatus for forming the semiconductive film is increased, or the impurities are discharged from the film by heat treatment after the semiconductive film is formed. Thus, it is preferable to reduce the concentration of the impurities in the semiconductive film.

The energy beams may be short-wavelength pulse laser, copper vapor laser, ruby laser or YAG laser, more specifically, ArF Excimer laser, $F_2$ Excimer laser, KrF excimer laser, XeCl Excimer laser or XeF Excimer laser. The conditions of irradiation is as follows.

TABLE 1

| | |
|---|---|
| Intensity of laser energy density | 200 to 600 mJ/cm$^2$ |
| Irradiation atmosphere | Vacuum or inert gas |
| Diameter of laser beam | 2 × 2 mm$^2$ to 15 × 15 mm$^2$ |
| Uniformity of beam intensity | Within ± 5% |

Especially, referring to laser irradiation, one region to be irradiated is preferably irradiated by a lasers with 10 pulses or more to be polycrystallized. It is more preferable for the polycrystallization of the film that the semiconductive film is irradiated with laser beams, while the substrate having the semiconductive film is heated at a temperature within a range of 100° to 600° C., more preferably, 200° to 500 C°. According to this embodiment of the present invention, the film is polycrystallized at approximately 400° C.

During the above irradiation, the polycrystallization is grown along an orientation in which surface free energy of the semiconductor is minimized, that is, in the lateral direction parallel to the film surface. Especially, in a case of a silicon film whose surface is a free surface, it is oriented to a 111 surface.

Although it is not used in the instant embodiment, a cap film such as an oxide film formed of SiOx or the like, or a nitrogen oxide film formed of SiNx or the like is previously formed on a surface of an amorphous semiconductive film or a polycrystalline semiconductive film to be irradiated, and energy beams are applied to the film through the cap film, whereby the orientation direction can be controlled so as to be <100> or <100>.

Referring to driving force of crystal growth in the lateral direction, because of anisotropy of the surface free energy, a value of the surface free energy varies at a step difference portion previously provided on the substrate surface. Consequently, the crystal growth in the lateral direction is stopped at the step difference portion.

Therefore, by controlling the size or the position of the region having small planes, the grain boundaries can be generated at a desired position. In addition, the size of the crystal grain can be set at a desired value by adjusting a distance between the adjacent step difference portions.

It is believed that the grain boundaries could be generated in the crystal grains in the region depending upon the distance between the adjacent step difference portions, since the crystal grains dissolved by the grain boundaries are all aligned with 111 surface as described above, even if such grain boundaries are generated in the small region, it exerts only a small influence upon an electrical characteristic of the polycrystalline semiconductive film.

Thus, in a case where the polycrystalline semiconductive film of the present invention is used as, for example a channel region of a thin film transistor, it is possible to make a state where grain boundaries do not exist in the polycrystalline semiconductive film of the channel region, whereby carrier are not prevented from moving and then, there can be provide a device having a good switching characteristic.

In addition, according to the polycrystalline semiconductive film of the present invention, crystallinity in the crystal grains surrounded by the grain boundaries is of high quality in which a defective density in the grains is low as compared with the film formed by a solid phase crystallization.

The polycrystalline semiconductive film of the present invention may be used for a semiconductive material for photoelectric conversion in a solar cell. In this case, it is preferable to provide a collecting electrode for collecting light carriers on a surface of the polycrystalline semiconductive film having the grain boundaries whose positions are specified by the step difference portions. In this case, since the grain boundaries which do not contribute to generation of electricity exist under the collecting electrode preventing light irradiation, efficiency per unit area is not degraded. Furthermore, since the collecting electrode is provided in the vicinity of the grain boundaries which generally recombine light carriers and exert a bad influence upon the photovoltaic conversion characteristic, such recombination can be prevented.

Still further, according to the polycrystalline semiconductive film of the present invention, since the positions of the grain boundaries which reduce a mechanical strength as a semiconductor can be controlled, the mechanical strength as the semiconductor can be controlled. Thus, for example, it can be used for a polycrystalline semiconductive material for a micromachine.

Although description was only given to the polycrystalline silicon film in the above embodiment of the present invention, the polycrystalline semiconductive film and its manufacturing method of the present invention are not limited to the above, but may be applied to a semiconductive film formed of germanium, gallium or the like.

Next, referring to FIGS. 3A to 3E, a first embodiment in which the polycrystalline semiconductive film according to the present invention is used for a semiconductive material for photoelectrical conversion in a pn conjunction type solar cell.

Figure 3A:
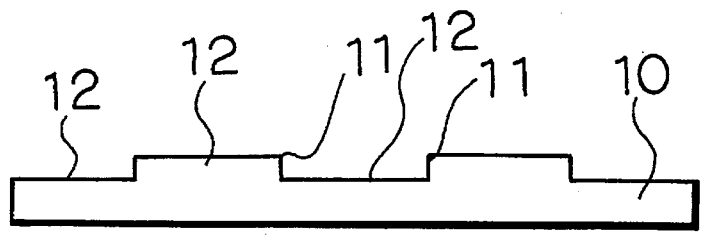
FIGS. 3A to 3E are sectional views showing a manufacturing process of the polycrystalline semiconductive film of the present invention used for a pn junction type solar cell according to a first embodiment.

First, as shown in FIG. 3A, which is made using the steps of the above embodiment shown in FIGS. 1A and 1B, a resist is patterned to form many small plane regions of certain configurations and then, reactive ion etching is carried out using the resist as a mask, whereby there formed are indentations on the surface of the substrate. The indentations consist of many small planes 12 and step difference portions 11 formed between the adjacent planes 12. According to the instant embodiment of the present invention, a substrate is formed of a high melting point metal such as tantalum (Ta), tungsten (W), and this substrate 10 is used as one electrode. In addition, the step difference 11 is 100 to 500 Å in depth and a width between the step difference portions, that is, small regions 12 are from 200 μm to 2 cm.

Figure 3B:
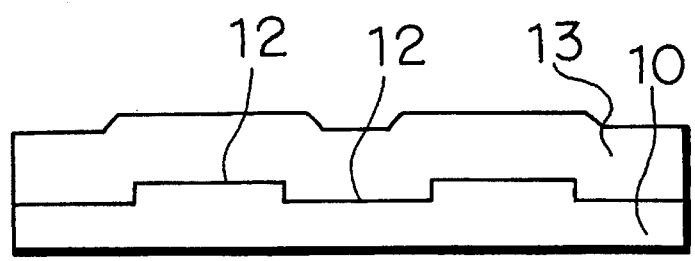

Then, according to a step shown in FIG. 3B, an n-type amorphous silicon film 13 doped with phosphorus is formed on the substrate 10 having a surface with indentations of small regions 12 by a plasma CVD method so as to be 500 to 2000 Å in thickness. The film is formed under the conditions such that the gas flow rates of $SiH_4$ is 30 to 80 sccm, the gas flow rates of phosphine ($PH_3$) is 10 to 30 sccm, a substrate temperature is 400° to 600° C., pressure is 13.3 to 266 Pa, and power supplied is at a frequency of 13.56 MHz and 30 to 100 W.

Figure 3C:
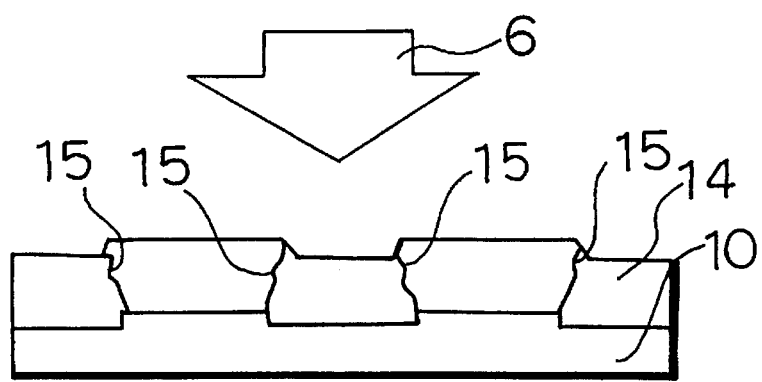

Then, according to a step shown in FIG. 3C, the n-type amorphous silicon film 12 is irradiated with Excimer lasers 6 and the irradiated region is polycrystallized, whereby an n-type polycrystalline semiconductive film 14 formed of polycrystalline silicon is obtained. In this case, the film is formed under the conditions such that a laser energy density is 200 to 500 mJ/cm², the number of laser pulses is 100 to 1000, and a substrate temperature during laser irradiation is 300° to 500° C. At this time, the n-type polycrystalline semiconductive film 14 is formed such that grain boundaries 15 are aligned at the step difference portions 11 of the substrate 10.

Then, similar to the step shown in FIG. 3B and the step shown in FIG. 3C, a step of forming the n-type amorphous silicon film on the n-type polycrystalline semiconductive film 14 and the step of polycrystallization by the Excimer lasers 6, respectively are repeated to form the n-type polycrystalline film 14 of 10 to 50 μm thickness. The reason for repeating the steps of forming the amorphous silicon film and polycrystallization is that since a thickness of approximately 2000 Å is the limit to obtain a high-quality film in polycrystallization by the Excimer lasers, a desired film thickness is obtained by laminating layers of high-quality films. In addition, when the polycrystalline semiconductive film layer is laminated on the lower film layer, the film should continue the grain boundaries so that the grain boundaries are formed at the same position. More specifically, the grain boundaries 15 are aligned at the step difference portions 11 of the substrate 10.

Figure 3D:
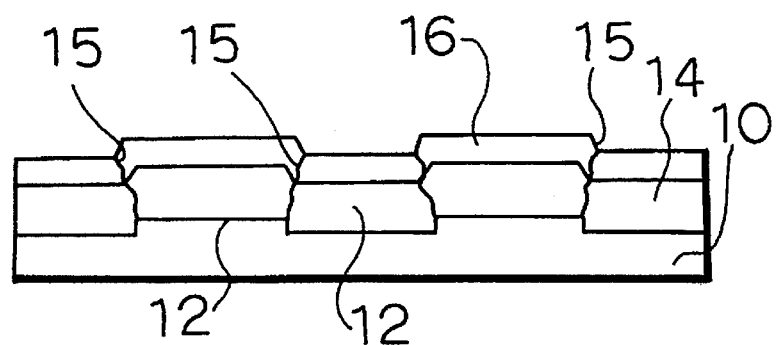

Then, according to a step shown in FIG. 3D, boron or the like is diffused onto the surface of the polycrystalline semiconductive film 14 by heat diffusion to form a p-type polycrystalline semiconductive layer 16. A depth of junction in this case is 0.1 μm.

Figure 3E:
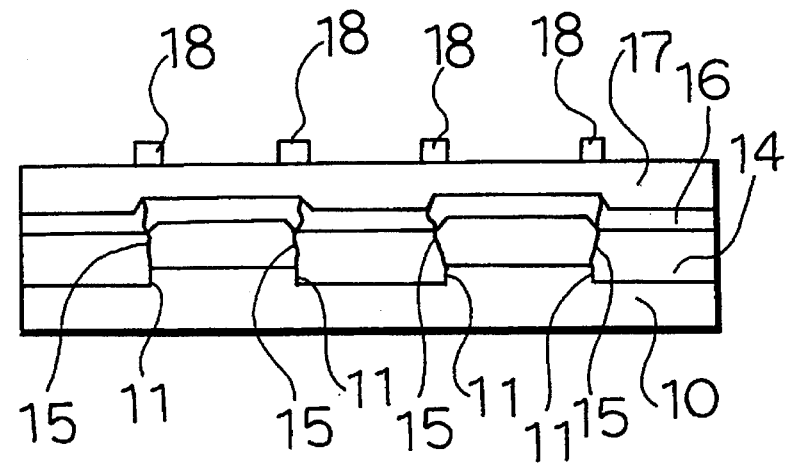

Then, according to a step shown in FIG. 3E, a transparent electrode 17 made of ITO or the like is formed on the p-type polycrystalline semiconductive layer 16 by sputtering to be 500 to 2000 Å in thickness, and collecting electrodes 18 made of aluminum (Al) are formed above the step difference portions 11 on the substrate, that is, the grain boundaries 15, whose positions are controlled, in the polycrystalline semiconductive film 14.

Thus, the collecting electrodes for collecting light carriers are provided on the surface of the polycrystalline semiconductive film having the grain boundaries whose positions are specified by the step difference portions, which means that the collecting electrodes are provided in the vicinity of the grain boundaries which generally recombine the light carriers and exert an adverse influence upon the photovoltaic conversion characteristic, whereby the light carriers are prevented from being recombined.

Next, a second embodiment in which the polycrystalline semiconductive film of the present invention is used for a semiconductor material for photovoltaic conversation in a pn junction type solar cell will be described according to FIGS. 4A to 4D.

Similar to the steps shown in FIGS. 3A to 3C of the first embodiment, step difference portions 11 of 100 to 500 Å depth and 200 μm to 2 cm width are formed on the substrate 10 made of a high melting point metal such as Ta or W, so that many small regions 12 are formed. Then, an n-type amorphous silicon film 13 doped with phosphorus is formed by plasma CVD to be 500 to 2000 Å in thickness. Then, the amorphous silicon film 13 is polycrystallized by the Excimer lasers 6, whereby an n-type polycrystalline semiconductive film 14 having the grain boundaries at the step difference portions 11 of the substrate 10 is formed.

Figure 4A:
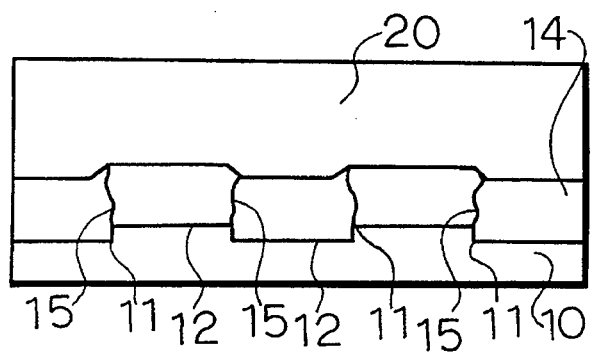
FIGS. 4A to 4D are sectional views showing a manufacturing process of the polycrystalline semiconductive film of the present invention used for the pn junction type solar cell according to a second embodiment.

Then, according to a step shown in FIG. 4A, an amorphous silicon film 20 doped with phosphorus is formed on the polycrystalline semiconductor 14 by the plasma CVD method to be 10 to 50 μm in thickness. The film is formed under the conditions such that the gas flow rates of $SiH_4$ is 30 to 80 sccm, the gas flow rates of $PH_3$ is 10 to 30 sccm, a substrate temperature 400° to 600° C., pressure is 13.3 to 266 Pa, and power is 13.56 MHz and 30 to 100 W.

Figure 4B:
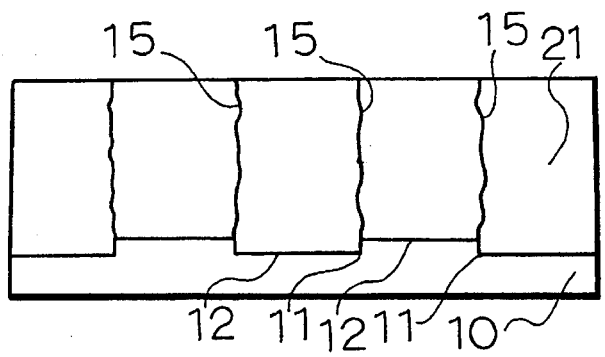

Then, according to a step shown in FIG. 4B, the amorphous silicon film 20 is polycrystallized at 500° to 700° C. for 20 hours by a solid phase crystallization, thereby forming a polycrystalline silicon film 21. At this time, as shown in FIG. 4B, since the polycrystalline silicon film 21 receives information of grain boundaries 15 of the polycrystalline silicon film 14 from the lower film, the grain boundaries 15 are formed at the same positions.

Figure 4C:
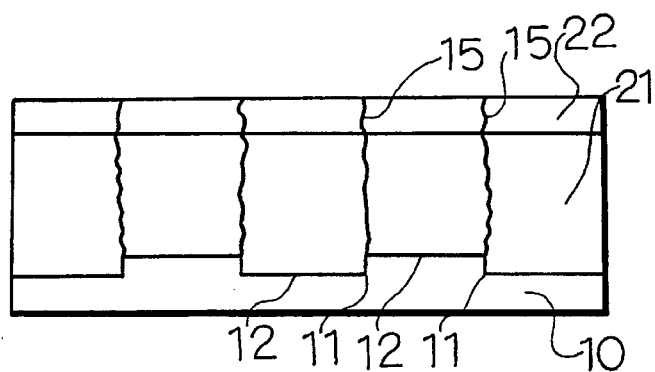

Then, according to a step shown in FIG. 4C, boron or the like is diffused to the surface of the polycrystalline semiconductive film 21 by heat diffusion, thereby forming a p-type polycrystalline semiconductive layer 22.

Figure 4D:
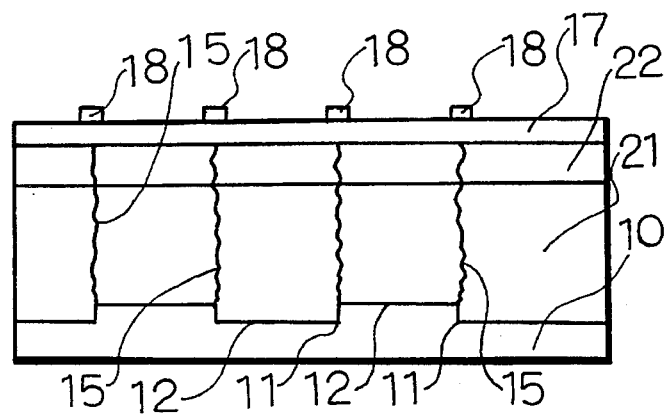

Then, according to a step shown in FIG. 4D, a transparent electrode 17 made of ITO or the like is formed on the polycrystalline semiconductive layer 22, and collecting electrodes 18 made of aluminum (Al) are formed above the step difference portions 11 on the substrate 10, that is, above the grain boundaries 15, whose positions are controlled, in the polycrystalline semiconductive film 21.

Thus, the collecting electrodes for collecting light carriers are provided on the surface of the polycrystalline semiconductive film having the grain boundaries whose positions are specified by the step difference portions, which means that the collecting electrodes are provided in the vicinity of the grain boundaries which generally recombine the light carriers and exert an adverse influence upon the photovoltaic conversion characteristic, whereby the light carriers are prevented from being recombined.

Next, a third embodiment in which the polycrystalline semiconductive film of the present invention is used for a semiconductive material for photovoltaic conversion in a solar cell will be described according to FIG. 5. According to this embodiment, an i-type amorphous silicon layer is interposed into a pn junction interface of the pn junction type solar cell.

Similar to the steps shown in FIGS. 3A to 3C of the first embodiment, step difference portions 11 of 100 to 500 Å depth and 200 μm to 2 cm width are formed on the substrate 10 of a high melting point metal such as Ta or W, so that many small regions 12 are formed. Then, an n-type amorphous silicon film 13 doped with phosphorus is formed by plasma CVD to be 500 to 2000 Å in thickness. Then, the amorphous silicon film 4 is polycrystallized by Excimer lasers 6, whereby an n-type polycrystalline semiconductive film having the grain boundaries at the step difference portions 11 of the substrate 10 is formed. Then, similar to the step shown in FIG. 3C, the polycrystallization by the Excimer lasers 6 is repeated to form an n-type polycrystalline film 13 of 10 to 50 μm thickness, or an amorphous silicon film doped with phosphorus is formed on the polycrystalline semiconductor by the plasma CVD method to be 10 to 50 μm thickness as shown in FIG. 4A and the amorphous silicon film is polycrystallized at 500° to 700° C. for 20 hours by the solid phase crystallization, thereby forming the polycrystalline silicon film. Consequently, a polycrystalline semiconductive film 21 is formed (referring to FIG. 5A).

Figure 5A:
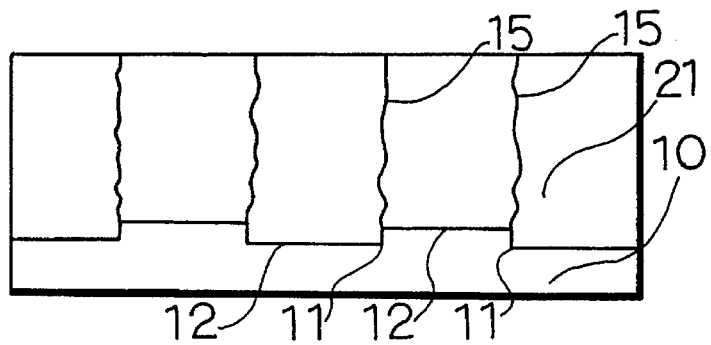
FIGS. 5A to 5D are sectional views showing a manufacturing process of the polycrystalline semiconductive film of the present invention used for the pn junction type solar cell according to a third embodiment.
Figure 5B:
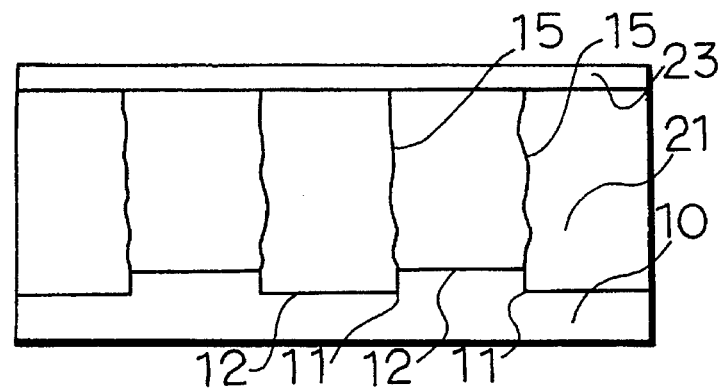

According to a step shown in FIG. 5B, an i-type amorphous silicon 23 of 20 to 350Å thickness formed on the polycrystalline semiconductive film 21 by a plasma CVD method. The film is formed under the conditions such that the gas flow rates of $SiH_4$ is 30 to 80 sccm, a substrate temperature 400° to 600° C., pressure is 13.3 to 266 Pa, and power is at a frequency of 13.56 MHz and 30 to 100 W.

Figure 5C:
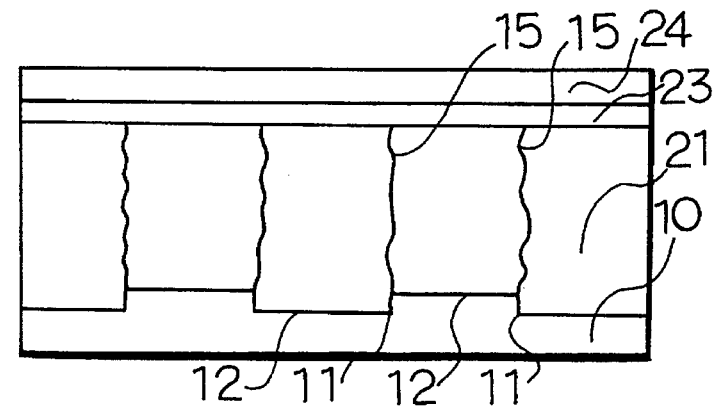
Figure 5D:
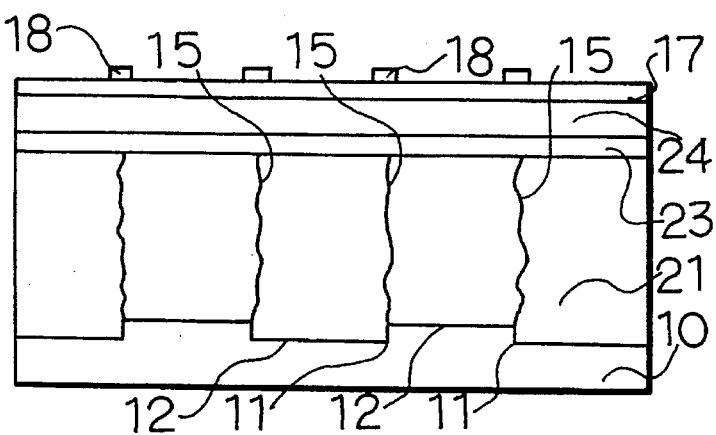

Then, according to a step shown in FIG. 5C, a p-type amorphous silicon 24 is formed on the i-type amorphous silicon 23 by the plasma CVD method to be 50 to 100 Å in thickness. The film is formed under the conditions such that the gas flow rates of $SiH_4$ is 30 to 80 sccm, the gas flow rates of diborane ($B_2H_6$) is 30 sccm, a substrate temperature 400° to 600° C., pressure is 13.3 to 266 Pa, and power is 13.56 MHz and 30 to 100 W.

Then, according to a step shown in FIG. 4D, a transparent electrode 17 is formed on the p-type amorphous silicon 24, and collecting electrodes 18 made of aluminum (Al) are formed above the step difference portions 11 on the substrate 10, that is, the grain boundaries 15, whose positions are controlled, in the polycrystalline semiconductive film 21.

In addition, although Excimer lasers are used in forming the polycrystalline semiconductive film, other types of lasers such as a YAG laser, may be employed.

As polycrystallizing methods, besides the above energy beam method, the following recrystallization method can be used, that is, solid phase crystallization, an RTA method in which a polycrystalline film or an amorphous film formed on a substrate is rapidly heated by a halogen lamp to be crystallized in a vacuum or inert gas atmosphere, a ZMR method in which a cap film of SiO is formed on the polycrystalline film or the amorphous film on the substrate, the complete films are heated at 1350° C., a region which is 1 mm in width and 50 to 125 mm in length is heated and melted at 1450° C. by a heater or converging mercury lamp and the melted region is scanned by 1 to 2 mm/sec to crystallize the complete film, or a method in which the film is heated and melted by a high frequency or alternating magnetic field.

Although the collecting electrodes are provided above the grain boundaries whose positions are controlled in the polycrystalline semiconductive film in the above embodiments of the present invention, the collecting electrodes may be further provided in the center of the grain boundaries. Thus, if the collecting electrodes for collecting light carriers are provided on the surface in the middle portion of the polycrystalline semiconductive film having the grain boundaries whose positions are specified by the step difference portions, recombination of the light carriers can be further prevented and efficiency of photovoltaic conversion is not degraded.

Figure 6A:
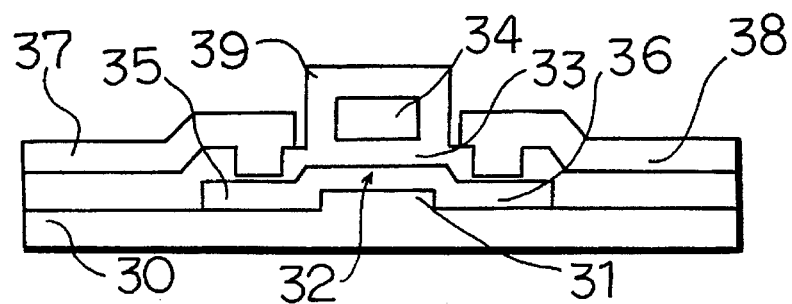
Figure 6B:
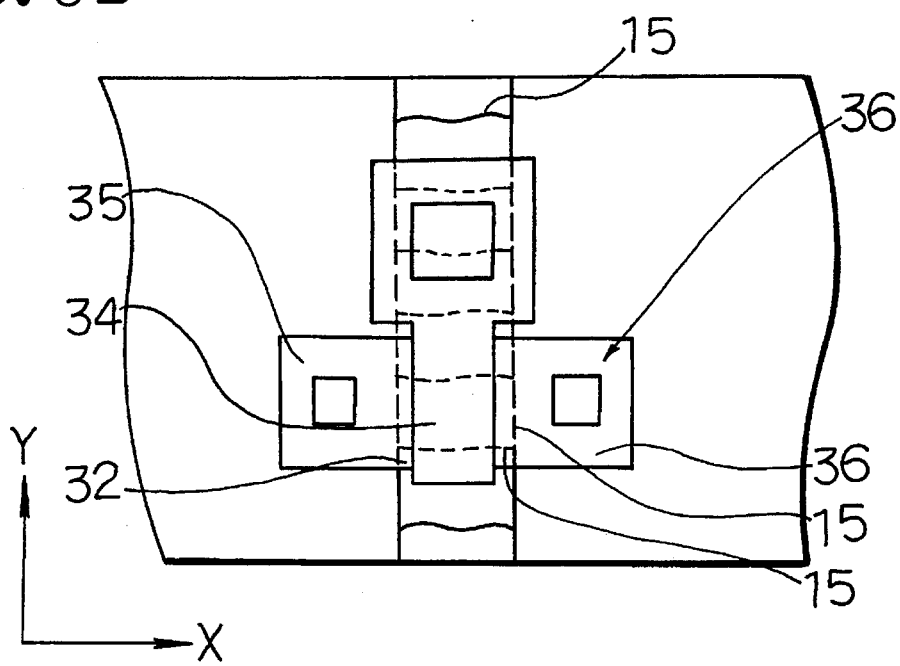

Next, description will be given to an embodiment of a thin film transistor (TFT) using the polycrystalline semiconductive film of the present invention as a channel according to FIGS. 6 and 7. FIG. 6A shows a sectional view of the TFT in the instant embodiment and FIG. 6B shows a plan view of the TFT which is viewed in the direction perpendicular to the plane of FIG. 6A and from which metal wirings are removed. According to the embodiment of the present invention, the channel of the TFT is formed on the polycrystalline silicon film having the grain boundaries controlled by providing a convex portions on the substrate. As can be seen from FIG. 6A, a convex portion 31 of 100 to 500 Å height is formed at the channel of the TFT on a transparent insulating substrate 30 formed of glass or the like. The polycrystalline semiconductive film 32 of the present invention is formed on the substrate 30. More specifically, a $p^-$ (or $n^-$ or i)-type amorphous silicon film having a thickness of 500 to 1000 Å is formed on the substrate 30 by plasma CVD, and irradiated with the Excimer lasers to be polycrystallized and then, the polycrystalline semiconductive film 32 is formed. A gate electrode 34 is formed on the convex portion 31 of the polycrystalline semiconductive film 32 through a gate insulating film 33, and n (or p)-type source and drain regions 35 and 36 are provided in self-alignment using the gate electrode 34 as a mask. In addition, there are provided source and drain electrodes 37 and 38 which are in ohmic contact with the source and drain regions 35 and 36, respectively through a protective film 39 of the gate electrode 34 and a contact hole. As shown in FIG. 6B, according to the TFT of the instant embodiment, the grain boundaries 15 crossing the channel at right angles, that is, in the Y axis direction are controlled so as to be positioned at the step difference portions and the grain boundaries 15 extend in the direction parallel to the channel, that is, in the X axis direction. Therefore, it is possible to implement a structure in which a current flowing between the source and drain regions does not cross the grain boundaries. As a result, a high-speed TFT can be provided.

Figure 7A:
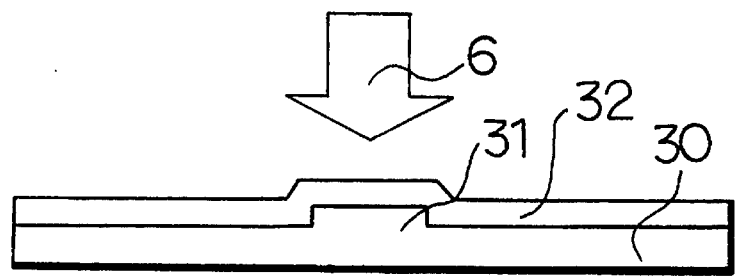
FIGS. 7A to 7C are sectional views showing a manufacturing process of the thin film transistor in which the polycrystalline semiconductive film of the present invention is used as the channel region.

Next, manufacturing process of the TFT of this embodiment of the present invention will be described according to FIGS. 7A to 7C. According to a step shown in FIG. 7A, a $p^-$-type amorphous silicon film is formed on a transparent insulating substrate 30 of glass or the like having a surface with the convex portion 31 of 100 to 500 Å height to be 500 to 1000 Å in thickness by, for example plasma CVD. The film is formed under such conditions that the gas flow rates of $SiH_4$ is 30 to 80 sccm, the gas flow rates of $B_2H_6$ is 0 to 30 sccm, a substrate temperature 400° to 600° C., pressure is 13.3 to 266 Pa, and power is at a frequency of 13.56 MHz and 30 to 100 W. Then, an amorphous silicon film is irradiated with the Excimer lasers 6 to be polycrystallized, thereby forming a $p^-$-type polycrystalline semiconductive film 32. At this time, a laser energy density is 150 to 350 mJ/cm$^2$, and a substrate temperature is 20° to 400° C. The grain boundaries 15 are positioned at the step difference portions in the polycrystallized semiconductive film 32 through the above polycrystallization.

Figure 7B:
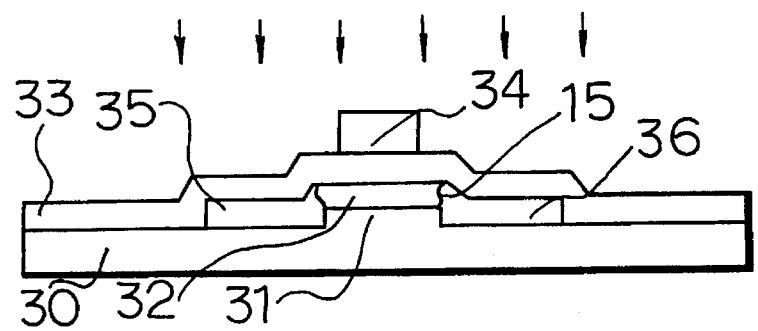

Then, according to a step shown in FIG. 7B, the polycrystalline semiconductive film 32 is patterned and then, a gate insulating film 33 of $SiO_2$ having a thickness of 1000 to 2000 Å is formed on the polycrystalline semiconductive film 32 by CVD or sputtering at substrate temperature of 200° to 600° C. Then, a polycrystalline silicon film is formed on the gate insulating film 33 by CVD or the like to be 500 to 2000 Å in thickness at a substrate temperature of 200° to 500° C. and then, a gate electrode 34 is formed after photolithography process.

In this state, using the gate electrode 34 as a mask, the source and drain regions are formed by implanting phosphorus with a dose of $2\times10^{15}$ to $10^{16}$cm$^{-2}$ and energy of 10 to 100 KeV. Thereafter, the source and drain regions 35 and 36 are activated and crystallinity of gate electrode 34 is recovered simultaneously by the Excimer lasers, heat annealing or the like. In addition, the activation is not performed in some cases depending on the ion implantation conditions or the like.

Figure 7C:
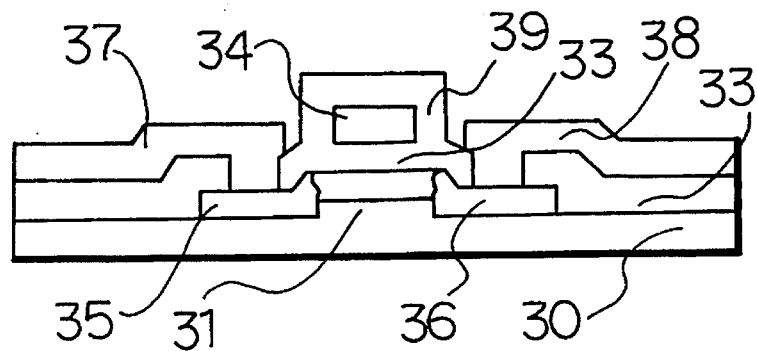

According to a step shown in FIG. 7C, a protective insulating film 39 is formed to be 500 to 1000 Å in thickness by a method such as CVD or sputtering. Then, a contact hole 1 to 2 µm square penetrating the protective insulating film 39 is formed in the source and drain regions 35 and 36 by photolithography and then, a metal film of Al, Cr or the like is formed by vapor deposition, sputtering or another method to be 8000 to 15000 Å in thickness. Then, the metal film is patterned by photolithography to form source and drain electrodes 37 and 38, whereby a thin film transistor is provided. Although P ions are used in the ion implantation in this step, arsenic (As) ions may be also used. In addition, the channel region may be formed of an $n^-$-type or i-type polycrystalline semiconductive film and boron (B) ions may be implanted into the source and drain regions.

Figure 8:
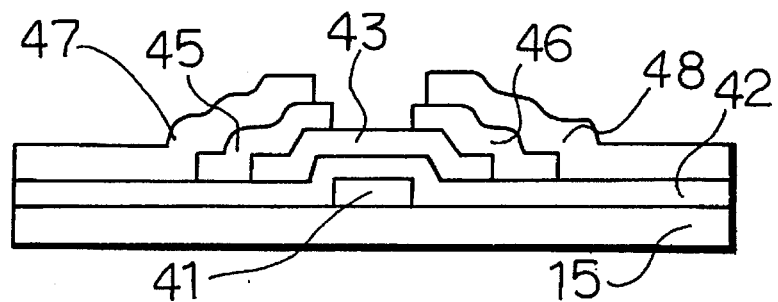
FIG. 8 is a sectional view showing the thin film transistor in which the polycrystalline semiconductive film of the present invention is used as the channel region.

Next, a second embodiment of the thin film transistor (TFT) in which the polycrystalline semiconductive film of the present invention is used as the channel will be described according to FIGS. 8 and 9. FIG. 8 is a sectional view showing the TFT according to this embodiment of the present invention. According to the instant embodiment, the grain boundaries in the polycrystalline semiconductor are controlled by a step difference portion of the gate electrode provided on a substrate and the channel of the TFT is formed on the polycrystalline silicon film. Referring to FIG. 8, a gate electrode 41 made of Cr, Mo, Ta or the like which is 500 Å or less in thickness is formed on a transparent insulating substrate 40 of glass. The gate electrode 41 forms a step difference of 500 Å or less on the substrate 40. Then, an insulating film 42 of 1000 to 2000 Å thickness is provided on the substrate 40 including the gate electrode 41 by CVD or the like. Then, the aforementioned polycrystalline semiconductive film 43 of the present invention is provided on the insulating film 42. The polycrystalline semiconductive film 43 is provided such that an amorphous silicon film of 500 to 1000 Å thickness is formed on the insulating film 42 by plasma CVD and then, it is polycrystallized by irradiation of the Excimer lasers. Then, an n-type amorphous silicon or a polycrystalline silicon film of 500 to 1000 Å thickness which is doped with phosphorus is formed on the polycrystalline semiconductive film 43 by plasma CVD and then, patterned so as to form source and drain electrodes 45 and 46. Then, source and drain electrodes 47 and 48 are provided on the source and drain regions 45 and 46, respectively, whereby the TFT of this embodiment is provided. Similar to the above embodiment of the present invention, the grain boundaries crossing the channel at right angles are controlled so as to be positioned at the step difference portion and the grain boundaries extend in the direction parallel to the channel. Therefore, it is possible to implement a structure in which a current between the source and drain regions does not cross the grain boundaries. Consequently, a high-speed TFT can be provided.

Figure 9A:
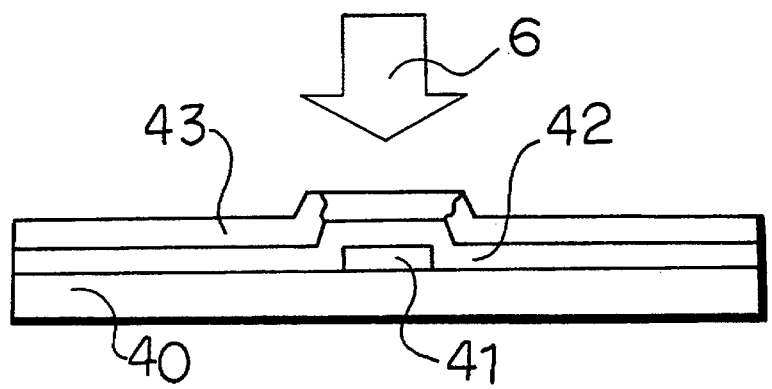
FIGS. 9A to 9C are sectional views showing a manufacturing process of the thin film transistor in which the polycrystalline semiconductive film of the present invention is used as the channel region.

Next, a manufacturing method of the thin film transistor according to a second embodiment of the present invention will be described according to FIGS. 9A to 9C.

First, a metal layer of Cr, Mo, Ta or the like serving as the gate electrode 41 is formed to be 500 Å or less in thickness on the transparent insulating substrate 40 by deposition or sputtering, and the metal layer is patterned to form the gate electrode 41. Thereafter, an insulating film 42 of 1000 to 2000 Å thickness is formed at 200° to 600° C. by CVD or sputtering. Then, an amorphous silicon film of 500 to 1000 Å thickness is formed on the insulating film 42 at a substrate temperature of 100° to 500° C. by PECVD, LPCVD, sputtering or deposition. Then, amorphous silicon film is irradiated with the Excimer lasers 6 to be polycrystallized to form the polycrystalline semiconductive film 43 under the conditions such that a laser energy concentration is 150 to 350 mJ/cm$^2$ and a substrate temperature is 20° to 400° C. By the above polycrystallization, the grain boundaries 15 are positioned at the step difference portions in the polycrystalline semiconductive film 43.

Figure 9B:
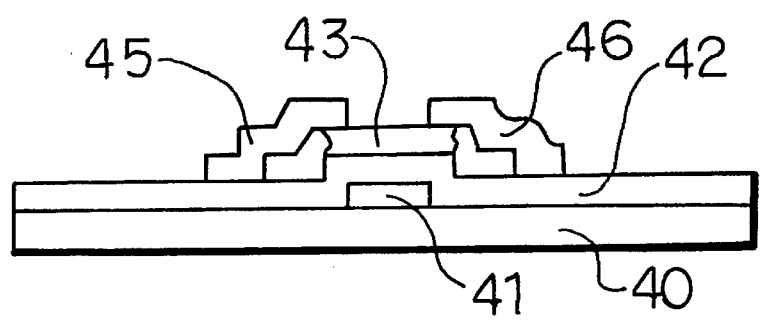

Then, according to a step shown in FIG. 9B, an n-type amorphous silicon film or polycrystalline silicon film doped with phosphorus is formed to be 500 to 1000 Å in thickness on the polycrystalline film 43 at a substrate temperature of 100° to 500° C. by PECVD, LPCVD, sputtering, deposition or the like. The semiconductor film doped with P is patterned through the photolithography process to form source and drain regions 45 and 46.

Figure 9C:
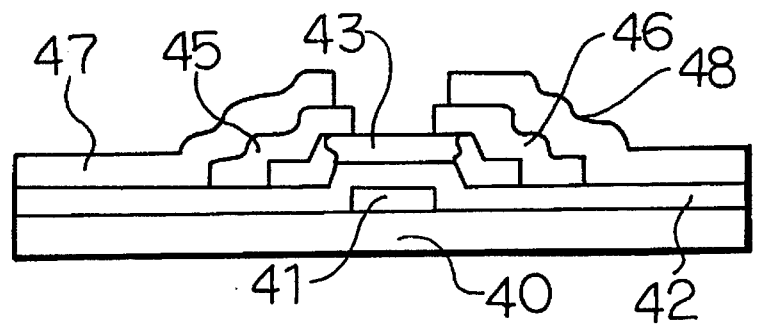

Then, according to a step shown in FIG. 9C, a metal film of Al, Cr or the like is formed to be 8000 to 15000 Å on the source and drain regions 45 and 46 by vapor deposition or sputtering. Then, the metal film is patterned by the photoresist process, thereby forming source and drain electrodes 47 and 48.

The TFT can be used for a liquid crystal display (LCD). The LCD consists of a peripheral driving part which needs to be driven at high speed and a pixel part which does not need speed. Thus, the TFT having controlled grain boundaries according to the present invention is applied to the TFT used in the peripheral driving part and the pixel part is manufactured by a conventional method with regard to a yield or the like.

Various details of the invention may be changed without departing from its spirit not its scope. Furthermore, the foregoing description of the embodiments according to the present invention is provided for the purpose of illustration only, and not for the purpose of limiting the invention as defined by the appended claims and their equivalents.

What is claimed is:

1. A polycrystalline semi,conductive film comprising
   a substrate having a surface with a plurality of spaced indentations defining plane regions and an elevated step difference portion having side walls between the adjacent plane regions; and
   a polycrystalline semiconductive film with grain boundaries being formed on said plane regions and step difference portion of said substrate, the grain boundaries of the film being position-controlled by said step difference portion side walls of the substrate surface.

2. A polycrystalline semiconductive film according to claim 1, wherein the grain boundaries in said polycrystalline semiconductive film are located above said step difference portion of said substrate.

3. A polycrystalline semiconductive film according to claim 1, wherein the height of the side walls of said step difference portion is in the range from about 30 to about 500 Å relative to said plane regions.

4. A polycrystalline semiconductive film according to claim 3, wherein the side walls of said step difference portion are at an angle of about 90 degrees relative to said plane regions.

5. A polycrystalline semiconductive film according to claim 1, wherein said step difference portion side walls are at an angle of about 90 degrees relative to said plane regions.

6. A semiconductor device comprising:
   a substrate having a surface with a plurality of spaced indentations defining a plurality of plane regions and an elevated step different portion between adjacent plane regions; and
   a polycrystalline semiconductive film with grain boundaries being formed on said plane regions and step difference portion of said substrate, the grain boundaries of the film being position-controlled by said step difference portion side walls of the substrate surface, and a semiconductor junction beneath said film.

7. A polycrystalline semiconductive film according to claim 6, wherein the grain boundaries in said polycrystalline semiconductive film are located above said step difference portion of said substrate.

8. A semiconductor solar cell device comprising:
   a substrate having a surface with a plurality of spaced indentations defining a plurality of plane regions, a plurality of elevated step difference portions each having side walls, each said step difference portion being located between adjacent plane regions;
   a polycrystalline semiconductive film with grain boundaries being formed on said plane regions and step difference portions of said substrate, the grain boundaries of the film being position-controlled by said step difference portion side walls of the substrate surface;
   a semiconductor junction being located beneath said film and photoelectromotive force being generated in the vicinity of said semiconductor junction; and
   a plurality of collecting electrodes located on said film, each collecting electrode being in the vicinity of a grain boundary.

9. A semiconductor device according to claim 8, further comprising a transparent electrode on said polycrystalline semiconductive film.

10. A semiconductor device according to claim 9, wherein each said collecting electrode is on said transparent electrode and is respectively positioned above a step difference portion of said substrate.

11. A semiconductor device according to claim 10, wherein a collecting electrode is provided on the transparent electrode positioned between adjacent step difference portions of said substrate.

12. A semiconductor device comprising:
   a substrate having a surface with a plurality of indented plane regions and an elevated step difference portion having side walls between adjacent regions;
   a polycrystalline semiconductive film of one conductivity type with grain boundaries being formed on said plane regions and said step difference portion of said substrate, the grain boundaries of the film being position-controlled by said stepped difference portion side walls of the substrate surface;

an intrinsic amorphous semiconductive layer formed on said polycrystalline semiconductive film; and an amorphous semiconductive film of the other conductivity type formed on said intrinsic semiconductive layer.

13. A semiconductor device according to claim 12, wherein said grain boundaries in said polycrystalline semiconductive film are located above the step different portion of said substrate.

14. A semiconductor device according to claim 13, further comprising a transparent electrode on said amorphous semiconductive layer of the other conductivity type.

15. A semiconductor device according to claim 13, further comprising a collecting electrode positioned on said transparent electrode above the step difference portion of said substrate.

16. A semiconductor device according to claim 15, further comprising a collecting electrode positioned on said transparent electrode between the step difference portions of said substrate.

17. A semiconductor device comprising:

a substrate having a surface with a plurality of indentations defining plane regions and an elevated step difference portion having side walls between the adjacent plane regions;

a polycrystalline semiconductive film with grain boundaries formed on said plane regions and step difference portion of said substrate, the grain boundaries of said film being position-controlled by said step difference portion side walls of the substrate surface; and source and drain regions formed to define a channel region therebetween which is sandwiched between grain boundaries in a direction such that current flowing between the source and drain regions does not cross over the grain boundaries.

18. A semiconductor device according to claim 17, wherein the grain boundaries in said polycrystalline semiconductive film are located above the step difference portion of said substrate.

19. A semiconductor device according to claim 18, wherein the height of the side walls of said step difference portion is in the range from about 30 to about 500 Å.

* * * * *